United States Patent [19]
Xiang et al.

[11] Patent Number: 6,060,377
[45] Date of Patent: May 9, 2000

[54] METHOD FOR FABRICATING A POLYSILICON STRUCTURE WITH REDUCED LENGTH THAT IS BEYOND PHOTOLITHOGRAPHY LIMITATIONS

[75] Inventors: Qi Xiang, Santa Clara; Scott A. Bell; Chih-Yuh Yang, both of San Jose, all of Calif.

[73] Assignee: Advanced Micro Devices, Inc., Sunnyvale, Calif.

[21] Appl. No.: 09/306,874

[22] Filed: May 7, 1999

[51] Int. Cl.⁷ ............................................ H01L 21/3205
[52] U.S. Cl. ........................ 438/585; 438/197; 438/595
[58] Field of Search .................................. 438/197, 585, 438/586, 587, 595

[56] References Cited

U.S. PATENT DOCUMENTS

| | | | |
|---|---|---|---|
| 5,837,588 | 11/1998 | Wu | 438/595 |
| 5,866,473 | 2/1999 | Xiang et al. | 438/585 |
| 5,937,319 | 8/1999 | Xiang et al. | 438/585 |

*Primary Examiner*—Trung Dang
*Attorney, Agent, or Firm*—Monica H. Choi

[57] ABSTRACT

A polysilicon structure is fabricated with a reduced length that is beyond that achievable from photolithography by using a silicidation anneal to control the reduced length. Generally, the present invention includes a step of forming a masking polysilicon structure having a first predetermined length defined by sidewalls on ends of the first predetermined length of the masking polysilicon structure. The present invention also includes a step of depositing a layer of metal on the sidewalls of the masking polysilicon structure. The layer of metal has a predetermined thickness. The layer of metal reacts with the masking polysilicon structure at the sidewalls of the masking polysilicon structure in a silicidation anneal to form metal silicide. The masking polysilicon structure has a second predetermined length that is reduced from the first predetermined length when the metal silicide has consumed into the sidewalls of the masking polysilicon structure after the silicidation anneal. The second predetermined length depends on the predetermined thickness of the layer of metal deposited on the sidewalls of the masking polysilicon structure. The masking polysilicon structure has the second predetermined length and is used as a mask for etching a first layer of polysilicon to form the polysilicon structure from the first layer of polysilicon. The remaining polysilicon structure after this etch has the reduced length that is substantially equal to the second predetermined length of the masking polysilicon structure. The present invention may be used to particular advantage when the polysilicon structure having the reduced length forms a gate electrode of a MOSFET (Metal Oxide Semiconductor Field Effect Transistor).

11 Claims, 3 Drawing Sheets

6,060,377

METHOD FOR FABRICATING A POLYSILICON STRUCTURE WITH REDUCED LENGTH THAT IS BEYOND PHOTOLITHOGRAPHY LIMITATIONS

TECHNICAL FIELD

This invention relates to integrated circuit fabrication, and more particularly, to a method for fabricating a polysilicon structure, such as a polysilicon gate of a MOSFET (Metal Oxide Semiconductor Field Effect Transistor), using silicidation anneal to achieve a reduced length that is beyond photolithography limitations.

BACKGROUND OF THE INVENTION

The present invention is described for achieving a reduced length of a polysilicon structure used as a gate electrode of a MOSFET (Metal Oxide Semiconductor Field Effect Transistor). However, the present invention may be used for fabrication of a polysilicon structure having a reduced length that is beyond photolithography limitations for any other type of application aside from just the example of a gate electrode of a MOSFET, as would be apparent to one of ordinary skill in the art from the description herein.

MOSFETs (Metal Oxide Semiconductor Field Effect Transistors) are a common component of integrated circuits. A typical MOSFET includes a drain, a source, a gate dielectric, and a gate electrode as known to one of ordinary skill in the art of integrated circuits. The gate electrode is comprised of a conductive material and is disposed to abut the gate dielectric. Polysilicon is commonly used as the gate electrode of a MOSFET.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

For improved performance of a MOSFET, the length of the gate electrode is further scaled down. As known to one of ordinary skill in the art, photolithography technology is commonly used for defining the size and shape of the gate electrode of a MOSFET in an integrated circuit. However, a bottleneck for further scaling down of the gate electrode of a MOSFET is the limitation of photolithography technology from optical diffraction, as known to one of ordinary skill in the art of integrated circuit fabrication. In current photolithography technology using UV (Ultra-Violet) or deep UV (Ultra-Violet) light as the illumination source for example, gate lengths that are smaller than 0.1 $\mu$m may not be achieved because of optical diffraction.

A prior art technology for achieving MOSFET gate lengths that are beyond those achievable from photolithography technology is photoresist trimming. In this prior art technology, the photoresist layer used in a typical photolithography process is further etched down to smaller dimensions to achieve smaller device size. However, the size and shape of a structure fabricated using photoresist trimming may be difficult to control, as known to one of ordinary skill in the art of integrated circuit fabrication.

Thus, a method for fabricating a gate electrode with controllable reduced gate lengths that are beyond those achievable from photolithography technology is desired.

SUMMARY OF THE INVENTION

Accordingly, the present invention is a method for fabricating a polysilicon structure with a reduced length that is beyond that achievable from photolithography by using a silicidation anneal to control the reduced length. Generally, the present invention includes a step of forming a masking polysilicon structure having a first predetermined length defined by sidewalls on ends of the first predetermined length of the masking polysilicon structure. The present invention also includes a step of depositing a layer of metal on the sidewalls of the masking polysilicon structure. The layer of metal has a predetermined thickness.

The layer of metal reacts with the masking polysilicon structure at the sidewalls of the masking polysilicon structure in a silicidation anneal to form metal silicide. This metal silicide is comprised of the layer of metal that has reacted with the masking polysilicon structure at the sidewalls of the masking polysilicon structure. The masking polysilicon structure has a second predetermined length that is reduced from the first predetermined length when the layer of metal has consumed into the sidewalls of the masking polysilicon structure after the silicidation anneal. The second predetermined length depends on the predetermined thickness of the layer of metal deposited on the sidewalls of the masking polysilicon structure. The masking polysilicon structure has the second predetermined length and is used as a mask for etching a first layer of polysilicon to form the polysilicon structure from the first layer of polysilicon. The remaining polysilicon structure after this etch has the reduced length that is substantially equal to the second predetermined length of the masking polysilicon structure.

The present invention may be used to particular advantage when the polysilicon structure having the reduced length forms a gate electrode of a MOSFET (Metal Oxide Semiconductor Field Effect Transistor).

These and other features and advantages of the present invention will be better understood by considering the following detailed description of the invention which is presented with the attached drawings.

BRIEF DESCRIPTION OF THE DRAWINGS

FIG. 1, including

FIG. 2, including

FIG. 3, including

FIG. 4, including

The figures referred to herein are drawn for clarity of illustration and are not necessarily drawn to scale. Moreover, the figures referred to herein focus on a few regions within a larger integrated circuit. Elements having the same reference number in FIGS. 1, 2, 3, 4, and 5 refer to elements having similar structure and function.

DETAILED DESCRIPTION

The present invention is described for achieving a reduced length of a polysilicon structure used as a gate electrode of a MOSFET (Metal Oxide Semiconductor Field Effect Transistor). However, the present invention may be used for fabrication of a polysilicon structure having a reduced length that is beyond photolithography limitations for any other type of application aside from just the example of a gate electrode of a MOSFET, as would be apparent to one of ordinary skill in the art from the description herein.

Figure 1A:
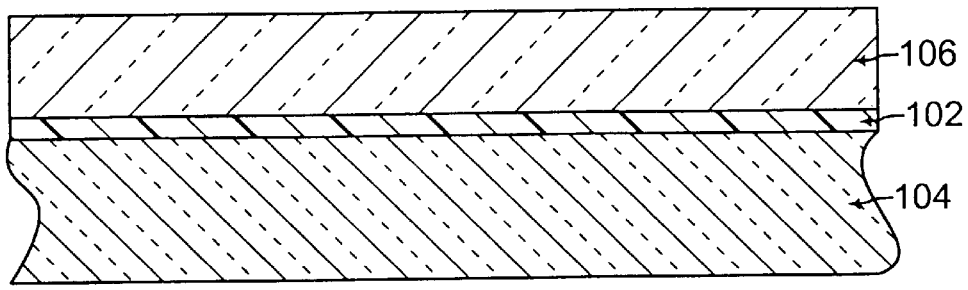
FIGS. 1A, 1B, and 1C, illustrates with cross sectional views, the steps for forming a polysilicon masking structure having a first predetermined length, according to an embodiment of the present invention.

Referring to FIG. 1A, for fabrication of a polysilicon structure that is used as a gate electrode of a MOSFET, a layer of gate dielectric 102 (such as silicon dioxide) is formed on a semiconductor substrate 104. A first layer of polysilicon 106 is formed on the layer of gate dielectric 102. The polysilicon structure of the present invention, having the reduced length beyond that achievable with photolithography technology, is formed from the first layer of polysilicon 106.

Figure 1B:
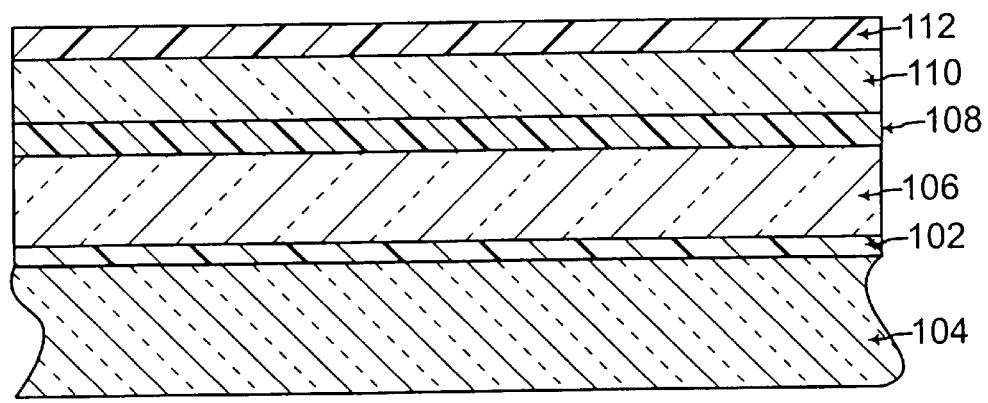

Referring to FIG. 1B, a hardmask layer 108 is formed on the first layer of polysilicon 106. The hardmask layer 108 may be comprised of silicon nitride (SiN). According to the present invention, for forming a masking polysilicon structure, a second layer of polysilicon 110 is formed on the hardmask layer 108, and a silicon oxynitride (SiON) layer 112 is formed on the second layer of polysilicon 110. Technologies for forming the layer of gate dielectric 102, the first and second layers of polysilicon 106 and 110, the hardmask layer 108, and the silicon oxynitride layer 112 are known to one of ordinary skill in the art of integrated circuit fabrication.

Figure 1C:
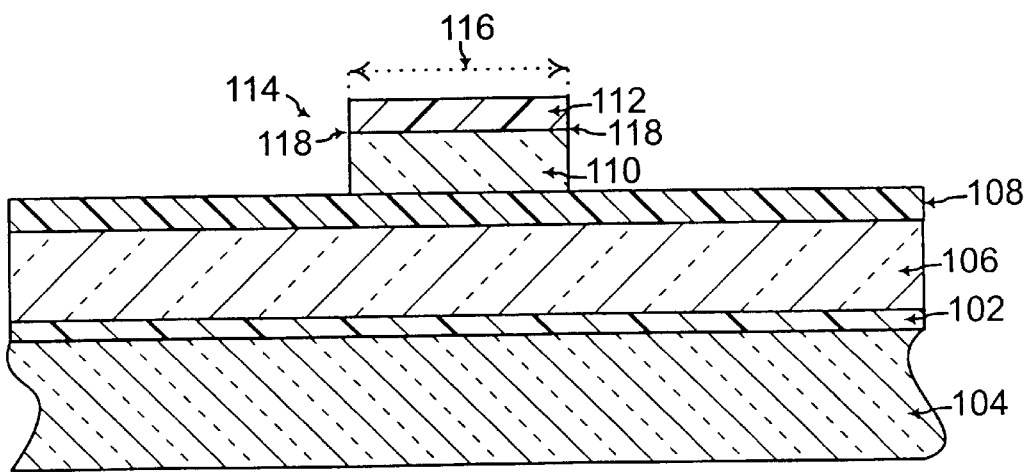

Referring to FIG. 1C, a masking polysilicon structure 114 of the present invention is formed by patterning the silicon oxynitride layer 112 and the second layer of polysilicon 110 with an etching process such as RIE (Reactive Ion Etching) that is known to one of ordinary skill in the art of integrated circuit fabrication. The silicon oxynitride layer 112 acts as a BARC (Bottom Anti-Reflective Coating) during the etching process for improved resolution during the patterning of the silicon oxynitride layer 112 and the second layer of polysilicon 110 to form the masking polysilicon structure 114. The masking polysilicon structure 114 comprises the silicon oxynitride layer 112 having a first predetermined length 116 and the second layer of polysilicon 110 having the first predetermined length 116.

Referring to FIG. 1C, the first predetermined length 116 is defined by sidewalls 118 at the ends of the first predetermined length 116 of the masking polysilicon structure 114.

Referring to FIG. 1C, in the etching process for patterning the silicon oxynitride layer 112 and the second layer of polysilicon 110 to form the masking polysilicon structure 114, the hardmask layer 108 may be an etch stop. Etching of portions of the silicon oxynitride layer 112 and the second layer of polysilicon 110 stops when portions of the hardmask layer 108 are exposed. Thus, the hardmask layer 108 is exposed where the masking polysilicon structure 114 does not cover the hardmask layer 108.

Figure 2A:
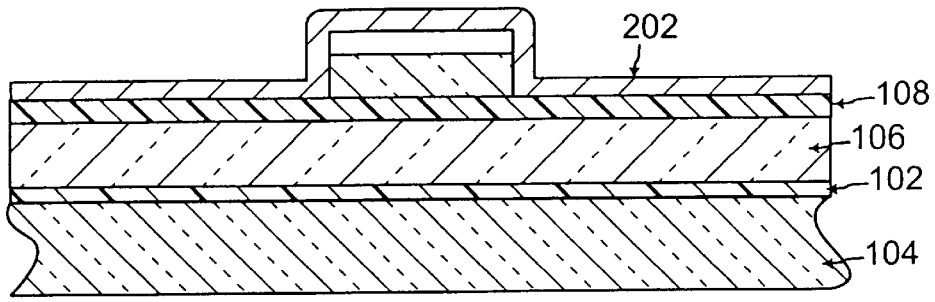
FIGS. 2A and 2B, illustrates with cross sectional views, the steps for depositing a metal on the sidewalls of the polysilicon masking structure of FIG. 1, according to an embodiment of the present invention.

Referring to FIGS. 1C and 2A, a layer of metal 202 is conformally deposited on the top and the sidewalls 118 of the masking polysilicon structure 114 and on any exposed areas of the hardmask layer 108. For conformal deposition of the layer of metal 202, a deposition process such as CVD (Chemical Vapor Deposition), as known to one of ordinary skill in the art of integrated circuit fabrication, may be used. The layer of metal 202 has a predetermined thickness that is controllable during the deposition process.

Figure 2B:
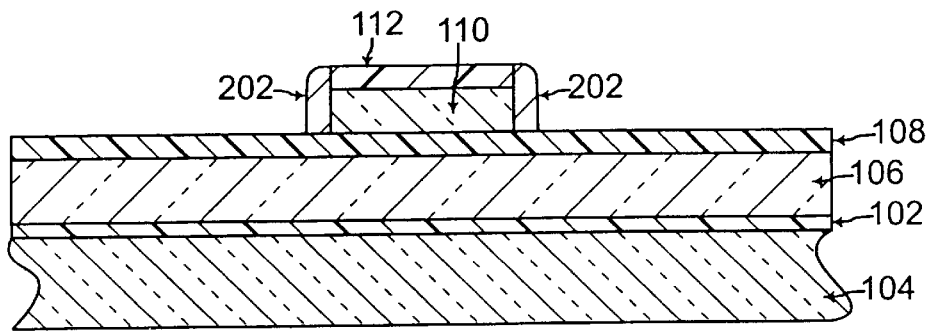

Referring to FIG. 2B, the layer of metal 202 is anisotropically etched with an etching process such as RIE (Reactive Ion Etching), as known to one of ordinary skill in the art of integrated circuit fabrication, from the top of the masking polysilicon structure 114 and the exposed areas of the hardmask layer 108. In this etching process, the silicon oxynitride layer 112 and/or the hardmask layer 108 may be used as an etch stop. After such an etching process, the layer of metal 202 remains on the sidewalls 118 of the masking polysilicon structure 114.

Figure 3A:
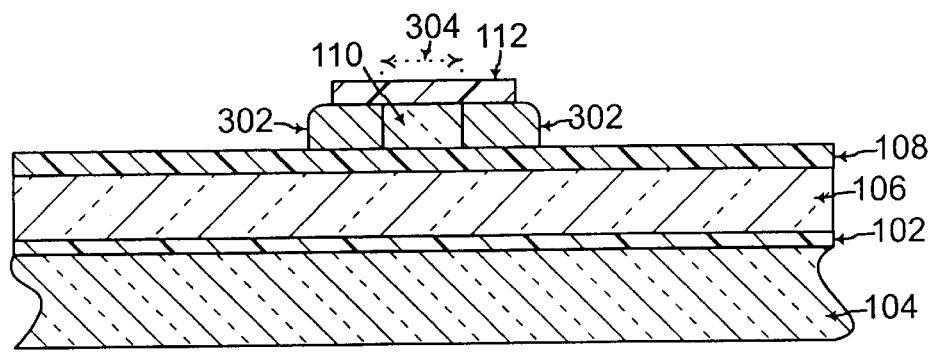
FIGS. 3A, 3B, and 3C, illustrates with cross sectional views, the steps for reducing the first predetermined length of the polysilicon masking structure of FIGS. 1 and 2 to a second predetermined length, using a silicidation anneal, according to an embodiment of the present invention.

Referring to FIGS. 2B and 3A, a silicidation anneal is performed such that the layer of metal 202 reacts with the polysilicon at the sidewalls 118 of the second layer of polysilicon 110 to form metal silicide 302. Referring to FIG. 3A, the metal silicide 302 has consumed into the sidewalls 118 of the second layer of polysilicon 110 such that the second layer of polysilicon 110 has a second predetermined length 304 after the silicidation anneal. Thus, referring to FIGS. 1C and 3A, the second predetermined length 304 of the second layer of polysilicon 110, after the silicidation anneal, is reduced from the first predetermined length 116 of the second layer of polysilicon 110 before the silicidation anneal. The amount of this reduction in length and thus the second predetermined length 304 of the second layer of polysilicon 10 depends on the amount of metal and thus on the predetermined thickness of the metal layer 202 deposited on the sidewalls 118 of the masking polysilicon structure 114 as illustrated in FIG. 2B.

Figure 3B:
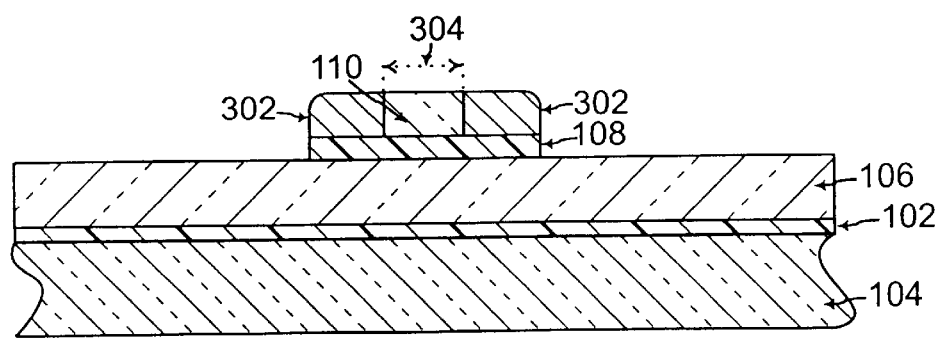

Referring to FIG. 3B, the silicon oxynitride layer 112 and the exposed areas of the hardmask layer 108 are removed by an anisotropic dry etching process as known to one of ordinary skill in the art of integrated circuit fabrication. Such an etching process may be selective to the polysilicon of the first polysilicon layer 106 and the second polysilicon layer 110 such that the etching stops when the polysilicon of the first and second polysilicon layers 106 and 110 is exposed.

Figure 3C:
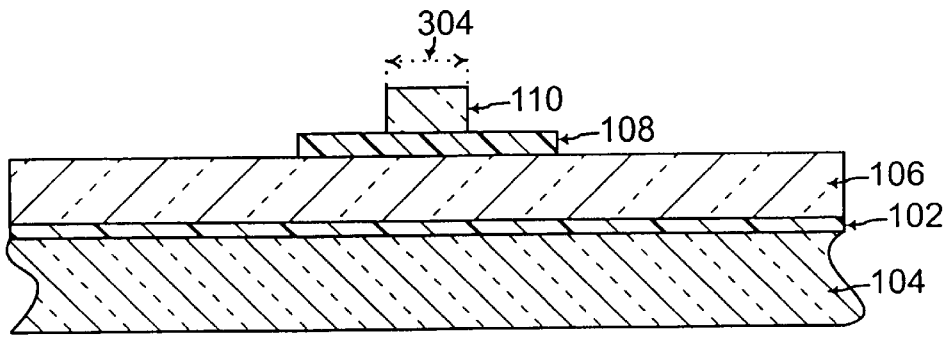

Referring to FIG. 3C, the metal silicide 302 at the sidewalls 118 of the second layer of polysilicon 110 is removed with a selective wet etch. Such an etching process is known to one of ordinary skill in the art of integrated circuit fabrication. A remaining second layer of polysilicon 110 has the second predetermined length 304.

Figure 4A:
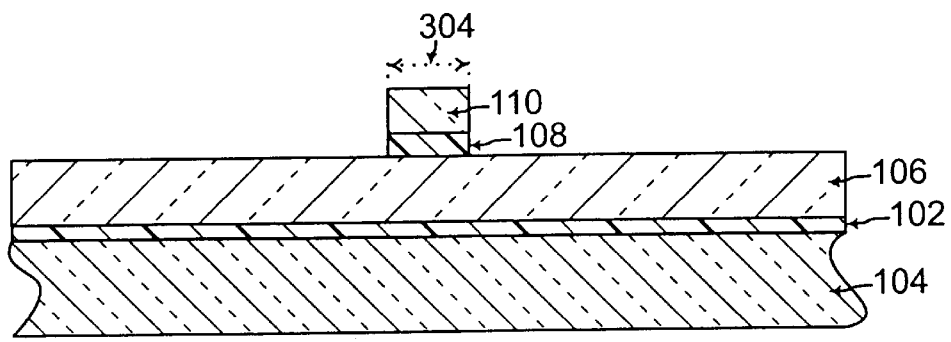
FIGS. 4A and 4B, illustrates with cross sectional views, the steps for using the polysilicon masking structure of FIG. 3 having the second predetermined length as a mask for etching the polysilicon structure having the reduced length that is beyond that achievable with photolithography.

The masking polysilicon structure having the second layer of polysilicon 110 with the second predetermined length 304 is then used as a mask for etching the first layer of polysilicon 106 to form the polysilicon structure with the reduced length that is substantially equal to the second predetermined length 304. Referring to FIG. 4A, any exposed area of the hardmask layer 108 is etched using the remaining second layer of polysilicon 110 as a mask such that a remaining hardmask layer 108 has the second predetermined length 304 and is disposed below the remaining second layer of polysilicon 110. An anisotropic RIE (Reactive Ion Etch) selective to polysilicon may be used for thus etching the exposed area of the hardmask layer 108, as known to one of ordinary skill in the art of integrated circuit fabrication.

Figure 4B:
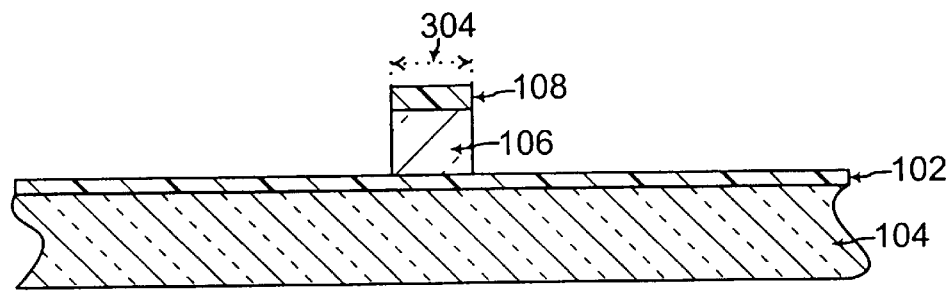

Referring to FIG. 4B, an etching process such as an anisotropic RIE (Reactive Ion Etch) that selectively etches silicon is used for removing the remaining second layer of polysilicon 110 and for patterning the first layer of polysilicon 106. In such an etching process, the remaining hardmask layer 108 is used as a mask such that the first layer of polysilicon 106 remains only under the remaining hardmask layer 108 to form the polysilicon structure of the present invention.

In this manner, referring to FIG. 4B, the polysilicon structure of the present invention is the remaining first layer of polysilicon 106 that has the reduced length that is substantially equal to the second predetermined length 304 of the remaining hardmask layer 108. Referring to FIGS. 1C and 3A, the second predetermined length 304 of the remaining second polysilicon layer 110 formed after the silicidation anneal is reduced from the first predetermined length 116 before the silicidation anneal. Referring to FIG. 1C, the first predetermined length 116 is determined from the photolithography technology used during patterning of the masking polysilicon structure 114. The first predetermined length 116 may be limited by photolithography technology.

Referring to FIG. 3A, the silicidation anneal further reduces the length of the remaining second layer of polysilicon 110 from the first predetermined length 116 to the second predetermined length 304. Thus, the second predetermined length 304 is smaller than that achievable with photolithography technology. Furthermore, referring to FIG. 2B, the amount of reduction from the first predetermined length 116 to the second predetermined length 304 is determined by the thickness of the layer of metal 202 deposited on the sidewalls 118 of the masking polysilicon structure 114. Thus, the reduced length of the polysilicon structure of the present invention may be better controlled than the prior art photoresist trimming technology.

Figure 5:
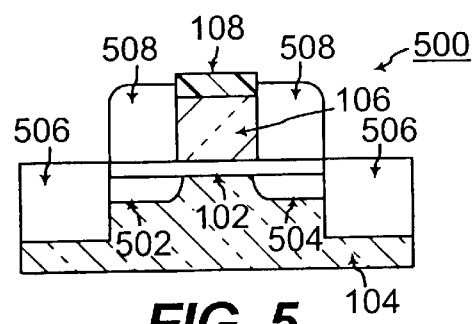
FIG. 5 shows use of the polysilicon structure having the reduced length as a gate electrode of a MOSFET (Metal Oxide Semiconductor Field Effect Transistor).

Referring to FIG. 5, the polysilicon structure of the present invention having the reduced length may advantageously be used as a gate electrode of a MOSFET 500 (Metal Oxide Semiconductor Field Effect Transistor). In that case, the layer of gate dielectric 102 is patterned to form the gate dielectric of the MOSFET 500. In addition, a drain 502 and a source 504 of the MOSFET is formed within the semiconductor substrate 104. Shallow trench isolation structures 506 and dielectric spacers 508 are also formed as part of the MOSFET 500. Fabrication technology for forming such parts of the MOSFET 500 are known to one of ordinary skill in the art of integrated circuit fabrication.

The foregoing is by way of example only and is not intended to be limiting. For example, the first and second layers of polysilicon 106 and 110 may be comprised of amorphous silicon. In addition, the present invention has been described for achieving a reduced length of a polysilicon structure used as a gate electrode of a MOSFET (Metal Oxide Semiconductor Field Effect Transistor). However, the present invention may be used for fabrication of a polysilicon structure having a reduced length that is beyond photolithography limitations for any other type of application aside from just the example of a gate electrode of a MOSFET, as would be apparent to one of ordinary skill in the art from the description herein.

Furthermore, as will be understood by those skilled in the art, the integrated circuit structures described herein may be made or used in the same way regardless of their position and orientation. Accordingly, it is to be understood that terms and phrases such as "sidewalls," "on," and "on top of" as used herein refer to the relative location and orientation of various portions of the structures with respect to one another, and are not intended to suggest that any particular absolute orientation with respect to external objects is necessary or required.

The invention is limited only as defined in the following claims and equivalents thereof.

We claim:

1. A method for fabricating a polysilicon structure with a reduced length, the method including the steps of:

A. forming a masking polysilicon structure having a first predetermined length defined by sidewalls on ends of said first predetermined length of said masking polysilicon structure;

B. depositing a layer of metal on said sidewalls of said masking polysilicon structure, said layer of metal having a predetermined thickness;

C. reacting said layer of metal with said masking polysilicon structure at said sidewalls of said masking polysilicon structure in a silicidation anneal to form metal silicide comprised of said layer of metal that has reacted with said masking polysilicon structure at said sidewalls of said masking polysilicon structure;

and wherein said masking polysilicon structure has a second predetermined length that is reduced from said first predetermined length when said layer of metal has consumed into said sidewalls of said masking polysilicon structure after said silicidation anneal;

and wherein said second predetermined length depends on said predetermined thickness of said layer of metal deposited on said sidewalls of said masking polysilicon structure in said step B; and D. using said masking polysilicon structure having said second predetermined length as a mask for etching a first layer of polysilicon to form said polysilicon structure from said first layer of polysilicon, said polysilicon structure having said reduced length that is substantially equal to said second predetermined length.

2. The method of claim 1, wherein said step A further includes the steps of:

forming a hardmask layer on said first layer of polysilicon;

forming a second layer of polysilicon on said hardmask layer;

forming a silicon oxynitride layer on said second layer of polysilicon; and patterning said silicon oxynitride layer and said second layer of polysilicon with an etching process to form said masking polysilicon structure comprising said silicon oxynitride layer having said first predetermined length and disposed on said second layer of polysilicon having said first predetermined length;

and wherein said hardmask layer is an etch stop in said step of patterning said silicon oxynitride layer and said second layer of polysilicon such that said hardmask layer is exposed where said masking polysilicon structure does not cover said hardmask layer.

3. The method of claim 2, wherein said second layer of polysilicon is a layer of amorphous silicon.

4. The method of claim 2, where said step B further includes the steps of:

depositing conformally a layer of metal on top and on said sidewalls of said masking polysilicon structure and on any exposed areas of said hardmask layer, and anisotropically etching said layer of metal from the top of said masking polysilicon structure and from said exposed areas of said hardmask layer such that said layer of metal remains on said sidewalls of said masking polysilicon structure.

5. The method of claim 4, wherein said metal silicide has consumed into said sidewalls of said second layer of polysilicon after said silicidation anneal such that said second layer of polysilicon has said second predetermined length after said silicidation anneal.

6. The method of claim 5, wherein said step D further includes the steps of:

etching away said layer of silicon oxynitride on said masking polysilicon structure;

etching away said metal silicide formed at said sidewalls of said second layer of polysilicon, wherein a remaining second layer of polysilicon has said second predetermined length;

etching away said exposed areas of said hardmask layer, wherein a remaining hardmask layer is disposed below said remaining second layer of polysilicon, and wherein said remaining hardmask layer has said second predetermined length;

etching said remaining second layer of polysilicon from said remaining hardmask layer; and patterning said first layer of polysilicon using said hardmask layer as a mask such that said first layer of polysilicon remains only under said hardmask layer to form said polysilicon structure having said reduced length that is substantially equal to said second predetermined length.

7. The method of claim 2, wherein said hardmask layer is a layer of silicon nitride.

8. The method of claim 1, wherein said polysilicon structure is a gate electrode of a MOSFET (Metal Oxide Semiconductor Field Effect Transistor), and wherein said method further includes the step of forming a drain, a source, and a gate dielectric of said MOSFET.

9. The method of claim 8, wherein said gate dielectric is comprised of silicon dioxide.

10. The method of claim 1, wherein said first layer of polysilicon is a layer of amorphous silicon.

11. A method for fabricating a polysilicon gate electrode of a MOSFET (Metal Oxide Semiconductor Field Effect Transistor), said polysilicon gate electrode having a reduced length, the method including the steps of:

A. forming a masking polysilicon structure having a first predetermined length defined by sidewalls on ends of said first predetermined length of said masking polysilicon structure, said step A further including the steps of:

forming a hardmask layer of silicon nitride on a first layer of polysilicon;

forming a second layer of polysilicon on said hardmask layer, forming a silicon oxynitride layer on said second layer of polysilicon; and patterning said silicon oxynitride layer and said second layer of polysilicon with an etching process to form said masking polysilicon structure comprising said silicon oxynitride layer having said first predetermined length and disposed on said second layer of polysilicon having said first predetermined length;

and wherein said hardmask layer is an etch stop in said step of patterning said silicon oxynitride layer and said second layer of polysilicon such that said hardmask layer is exposed where said masking polysilicon structure does not cover said hardmask layer;

B. depositing a layer of metal on said sidewalls of said masking polysilicon structure, said layer of metal having a predetermined thickness, wherein said step B further includes the steps of:

depositing conformally a layer of metal on top and on said sidewalls of said masking polysilicon structure and on any exposed areas of said hardmask layer; and anisotropically etching said layer of metal from the top of said masking polysilicon structure and from said exposed areas of said hardmask layer such that said layer of metal remains on said sidewalls of said masking polysilicon structure;

C. reacting said layer of metal with said masking polysilicon structure at said sidewalls of said masking polysilicon structure in a silicidation anneal to form metal silicide comprised of said layer of metal that has reacted with said masking polysilicon structure at said sidewalls of said masking polysilicon structure;

and wherein said masking polysilicon structure has a second predetermined length that is reduced from said first predetermined length when said layer of metal has consumed into said sidewalls of said masking polysilicon structure after said silicidation anneal;

and wherein said second predetermined length depends on said predetermined thickness of said layer of metal deposited on said sidewalls of said masking polysilicon structure in said step B;

and wherein said metal silicide has consumed into said sidewalls of said second layer of polysilicon after said silicidation anneal such that said second layer of polysilicon has said second predetermined length after said silicidation anneal; and D. using said masking polysilicon structure having said second predetermined length as a mask for etching said first layer of polysilicon to form said polysilicon gate electrode from said first layer of polysilicon, said polysilicon gate electrode having said reduced length that is substantially equal to said second predetermined length, wherein said step D further includes the steps of:

etching away said layer of silicon oxynitride on said masking polysilicon structure;

etching away said metal silicide formed at said sidewalls of said second layer of polysilicon, wherein a remaining second layer of polysilicon has said second predetermined length;

etching away said exposed areas of said hardmask layer, wherein a remaining hardmask layer is disposed below said remaining second layer of polysilicon, and wherein said remaining hardmask layer has said second predetermined length;

etching said remaining second layer of polysilicon from said remaining hardmask layer; and patterning said first layer of polysilicon using said hardmask layer as a mask such that said first layer of polysilicon remains only under said hardmask layer to form said polysilicon gate electrode having said reduced length that is substantially equal to said second predetermined length.

* * * * *